United States Patent [19]
Kapp

[11] 3,875,431
[45] Apr. 1, 1975

[54] DESTRUCTIBLE MICROELECTRONIC CIRCUIT ELEMENT

[75] Inventor: Edward J. Kapp, San Pedro, Calif.

[73] Assignee: The United States of America as represented by the secretary of the Navy, Washington, D.C.

[22] Filed: Oct. 16, 1970

[21] Appl. No.: 81,625

[52] U.S. Cl. ...................... 307/298, 357/4, 174/68.5
[51] Int. Cl. .......................................... H03k 19/168
[58] Field of Search ..................... 174/68.5; 307/298

[56] References Cited
UNITED STATES PATENTS 3,394,218 7/1968 Foudriat ........................... 174/68.5

*Primary Examiner*—Maynard R. Wilbur
*Assistant Examiner*—N. Moskowitz
*Attorney, Agent, or Firm*—R. S. Sciascia; Paul S. Collignon

[57] ABSTRACT

A destructible microelectronic circuit element having exothermic conductor films thereon together with thin film circuits with the exothermic films energized by a pulsed electrical energy source to destroy the identity of the thin film circuits to provide anti-compromise thin film electrical circuit modules.

2 Claims, 1 Drawing Figure

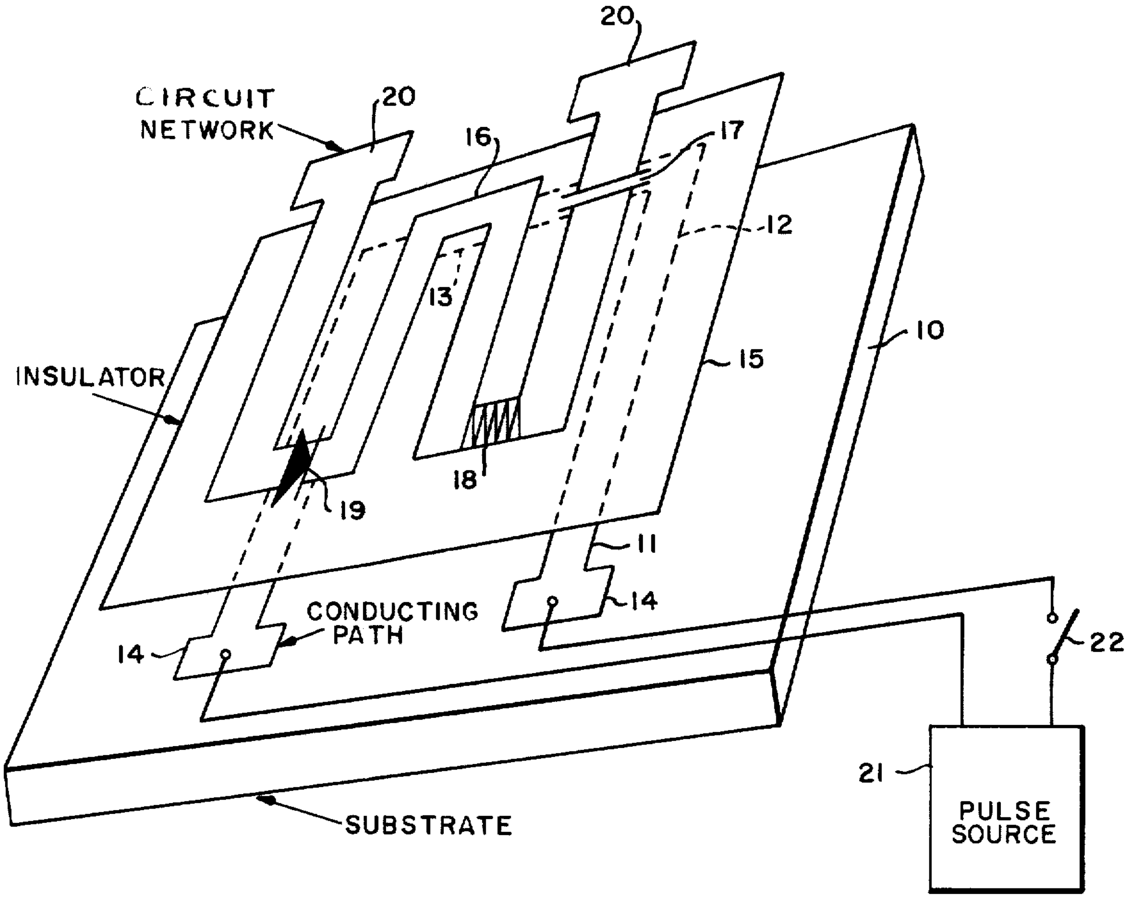
INVENTOR.
EDWARD J. KAPP
BY H. H. Losche
ATTORNEYS

DESTRUCTIBLE MICROELECTRONIC CIRCUIT ELEMENT

BACKGROUND OF THE INVENTION

This invention relates to self-destruct or anti-compromise electrical systems and more particularly to microelectronic circuit modules that have exothermic electrical films thereon which, when energized with electrical pulses, will destroy all thin film circuits on the module to the extent of being useless, unrecognizable, analysis free, and incapable of reconstruction.

Prior known means of circuit destruction relied on war heads, explosives or pyrotechnic materials placed in a package adjacent the circuits to be destroyed. The usual means has been a pyrotechnic package positioned against the case or support of electronic equipment to be destroyed by flame. Such pyrotechnic packages are objectionable because they require considerable external space and they only insure destruction by heat nearest the package; that is, the destruction is not uniform. In aircraft equipment such space for pyrotechnic packages is just not available.

SUMMARY OF THE INVENTION

In the present invention a conducting material, as aluminum palladium mixture, is deposited on a glass or ceramic substrate as a thin film, to provide a destructive film coating under thin film circuitry. The destructive film may be deposited in the form of a conductor under strategic portions of the thin film circuitry to insure destruction of the circuitry to the point of prevention of reconstruction, recognition, or analysis. The destructive aluminum-palladium film is coupled to a switched pulsing circuit which, when pulsed with electrical energy, will destroy the strategic portions of the thin film circuitry. It is accordingly a general object of this invention to provide a thin film module having a destructive film or films thereon between the substrate and the thin film circuitry capable of producing exothermic reactions upon being energized by an electrical pulsing energy to destroy the thin film circuit on the module with little energy loss.

BRIEF DESCRIPTION OF THE DRAWINGS

These and other objects and the attendant advantages, features and uses will become more apparent to those skilled in the art as a more detailed description proceeds when considered along with the accompanying drawing illustrating in an expanded view a destructive thin film circuit module.

DESCRIPTION OF THE PREFERRED EMBODIMENT

Referring more particularly to the drawing, a thin film circuit is constructed on a substrate 10 of ceramic or glass material which is an insulator of electrical currents. A thin film conductor 11 is vacuum deposited on the surface of the substrate 10 either through a metal mask or by thin film deposition which is photo-etched to produce a conductor means under an intended thin film circuit at strategic portions, such as by the conductor legs 12 and connecting portions 13, terminating in connector pads 14. The conductor 11 is preferably a mixture of aluminum-palladium materials which produce destructive exothermic reaction when an electrical high current pulse is passed therethrough. A thin film of insulating material 15, such as silicon monoxide, is vacuum deposited over the surface of the substrate 10 covering all but the connector pads 14 of the conductor circuit 11,12,13. Vacuum deposited on top of the insulator film 15 by mask, photo-etched means, or other known means, is a thin film circuit 16 which may include capacitors such as the capacitor 17 illustrated, resistors as 18 illustrated, and solid state devices such as the diode 19 illustrated, terminating in connector pads 20. The thin film circuit 16 overlies the destructive conductor circuit 11 with strategic portions, such as the elements 17, 18, and 19, overlying the conducting circuit 11 so that these strategic elements of the circuit will be destroyed at will.

The terminal pads 14 are coupled in circuit to a pulse source 21 through a switch 22 such that whenever the switch 21 is purposely closed to destroy the thin film circuit 16 by a high current pulse, the conductor circuit 11 will produce an exothermic reaction which will completely destroy the elements 17, 18, and 19 and other portions of the thin film circuit 16 at the will of the operator to avoid compromise of the circuit or a combination of such circuits in electronic equipment when it is apparent that it will fall into enemy hands. A combination of such circuits may have the destructive conductors coupled in parallel. When aluminum-palladium is used as the conductor film 11 and a high current pulse passed therethrough, the exothermic reaction will be violent to melt and disintegrate the elements 17, 18, and 19 beyond any recognition or use together with other parts of the thin film circuit 16. The pulse source 21 provides a low energy and highly reliable means of energizing the destructive circuit with great personal safety. Accordingly, an anti-compromise thin film circuit module is produced which may be duplicated in various forms and circuit options to provide a thin film circuit combination of modules for equipment used in the National Defense.

While many modifications may be realized from the single embodiment illustrated herein, it is to be understood that I desire to be limited in the spirit of my invention only by the scope of the appended claims.

I claim:

1. A self-destruct microelectronic thin film circuit module comprising:

a thin film circuit substrate of ceramic type material;

a conducting film conductor of an exothermic mixture of aluminum-palladium evaporated on said substrate to underlie a thin film circuit at strategic places of destruction;

a thin film of electrical insulating material of silicon monoxide evaporated on said substrate overlying said conducting film conductor;

a thin film circuit deposited over said silicon monoxide film with strategic portions overlying said conducting film; and a switched pulsing circuit coupled to said conducting film whereby upon closing the switch the energy pulses energize said conducting film to produce exothermic reaction to destroy said thin film circuit at said strategic places.

2. A self-destructive microelectronic thin film circuit module as set forth in claim 1 wherein said thin film circuit includes resistors, capacitors, and solid state elements, each of which overlie said conducting film conductor at said strategic places.

* * * * *